(12) United States Patent
Kim

(10) Patent No.: US 7,176,761 B2
(45) Date of Patent: Feb. 13, 2007

(54) APPARATUS AND METHOD FOR RECEIVING INPUTTED SIGNAL

(75) Inventor: Kyung-Hoon Kim, Ichon-shi (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 0 days.

(21) Appl. No.: 11/145,917

(22) Filed: Jun. 7, 2005

(65) Prior Publication Data

US 2006/0132236 A1     Jun. 22, 2006

(30) Foreign Application Priority Data

Dec. 20, 2004    (KR) ............... 10-2004-0108543

(51) Int. Cl.
*H03F 3/45*        (2006.01)
(52) U.S. Cl. ........................ 330/254; 330/129
(58) Field of Classification Search ............. 330/254, 330/129, 136, 279
See application file for complete search history.

(56) References Cited

U.S. PATENT DOCUMENTS

| | | | | |
|---|---|---|---|---|
| 5,367,268 A * | 11/1994 | Baba | ........................... | 330/129 |
| 6,573,779 B2 * | 6/2003 | Sidiropoulos et al. | ...... | 327/345 |
| 6,650,181 B2 * | 11/2003 | Shinjo et al. | ............... | 330/136 |
| 6,661,287 B2 * | 12/2003 | Lin et al. | .................... | 330/254 |
| 6,838,938 B2 * | 1/2005 | Sowlati et al. | ............... | 330/136 |

\* cited by examiner

*Primary Examiner*—Henry Choe
(74) *Attorney, Agent, or Firm*—McDermott Will & Emery LLP

(57) ABSTRACT

An input signal receiver of a semiconductor device includes a gain control unit for outputting a gain control signal and a variable gain amplifier for amplifying external clock in response to the gain control signal, wherein the gain control signal determines a gain of the variable gain amplifier. Further, the input signal receiver includes a buffer whose input terminal is connected to an output terminal of the variable gain amplifier and output terminal is connected to another element of the semiconductor device.

25 Claims, 10 Drawing Sheets

US 7,176,761 B2

APPARATUS AND METHOD FOR RECEIVING INPUTTED SIGNAL

FIELD OF INVENTION

The present invention relates to a semiconductor memory device; and, more particularly, to an input signal receiver including an amplifying device.

DESCRIPTION OF PRIOR ART

An input signal inputted to a semiconductor device can be easily distorted by various external circumstances such as external wires. Therefore, for reliable operation of the semiconductor device regardless of external conditions, an input signal receiver recovers a level of the input signal by amplifying distorted input signal.

FIG. 1 is a block diagram showing a conventional input signal receiver.

Referring to FIG. 1, the input signal receiver is provided with a static gain amplifier 10, a buffer IB_1, and a D flip-flop. The static gain amplifier 10 receives an external clock CLK and a reversed external clock CLKB as input signals. The buffer IB_1 is constituted with two inverters and connected between the static gain amplifier 10 and the D flip-flop. The D flip-flop delays an output signal from the buffer IB_1 synchronized with an internal clock CLK_INT.

Further, the static gain amplifier 10 is provided with two PMOS transistors P11 and P12 and three NMOS transistors N10, N11, and N12. The static gain amplifier 10 receives the input signals CLK and CLKB through gates of the NMOS transistors N11 and N12, respectively. A gain of the static gain amplifier 10 is determined according to a swing of the input signals, i.e., the external clock CLK and the reversed external clock CLKB. Also, the gain of the static gain amplifier 10 determines a delay time of the input signal receiver.

FIG. 2 is a graph showing a relationship between the gain of the amplifier 10 and the delay time of the input signal receiver.

Referring to FIG. 2, as the gain of the static gain amplifier 10 is increased, the delay of the input signal receiver is decreased.

Currently, a semiconductor device with a high operation speed and a low voltage consumption is steadily pursued. Therefore, the swing of an operation signal used in the semiconductor device becomes continuously smaller. Herein, the swing level is a level difference between a high level and a low level of the operation signal. The smaller swing level makes it harder to extract correct input signal. Further, if an expected swing level is changed according to several factors such as a noise and a main board, an optimal margin of an input signal receiver for performing set-up and holding operations becomes shorter. Therefore, a reliable operation cannot be guaranteed.

Moreover, for an operation performed under a high frequency state, the swing level is expected to be lowered. However, the amplifier with a static gain in accordance with the conventional art cannot control the gain corresponding to circumstances.

SUMMARY OF INVENTION

It is, therefore, an object of the present invention to provide an input signal receiver for operating reliably under unstable circumstances.

It is, therefore, another abject of the present invention to provide an input signal receiver including an amplifier having variable gain in response to various external conditions.

In accordance with an aspect of the present invention, there is provided an input signal receiver including a gain controlling unit for outputting a gain control signal determining a gain of the variable gain amplifier and a variable gain amplifier for amplifying external input signals in response to the gain control signal.

In accordance with an another aspect of the present invention, there is provided a semiconductor device for compensating an input signal including a clock variable gain amplifier for amplifying an external clock and an external reverse clock based on a gain control signal, an internal clock generator for generating an internal clock by using an output signal from the clock variable gain amplifier, an input variable gain amplifier for receiving the input signal through an input terminal of the semiconductor device and amplifying the input signal based on the gain control signal, a buffer for buffering an output signal from the input variable gain amplifier in response to the internal clock, and a gain control unit for outputting the gain control signal for determining a gain of the clock variable gain amplifier and the input variable gain amplifier.

In accordance with an still another aspect of the present invention, there is provided a method for sensing and compensating an input signal including steps of determining a level of an input signal corresponding to a peak point level of an external clock, generating a gain control signal having a level corresponding to the level of the input signal, and amplifying the input signal as much as a gain based on the gain control signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor device in accordance with the present invention will be described in detail referring to the accompanying drawings.

Figure 1:
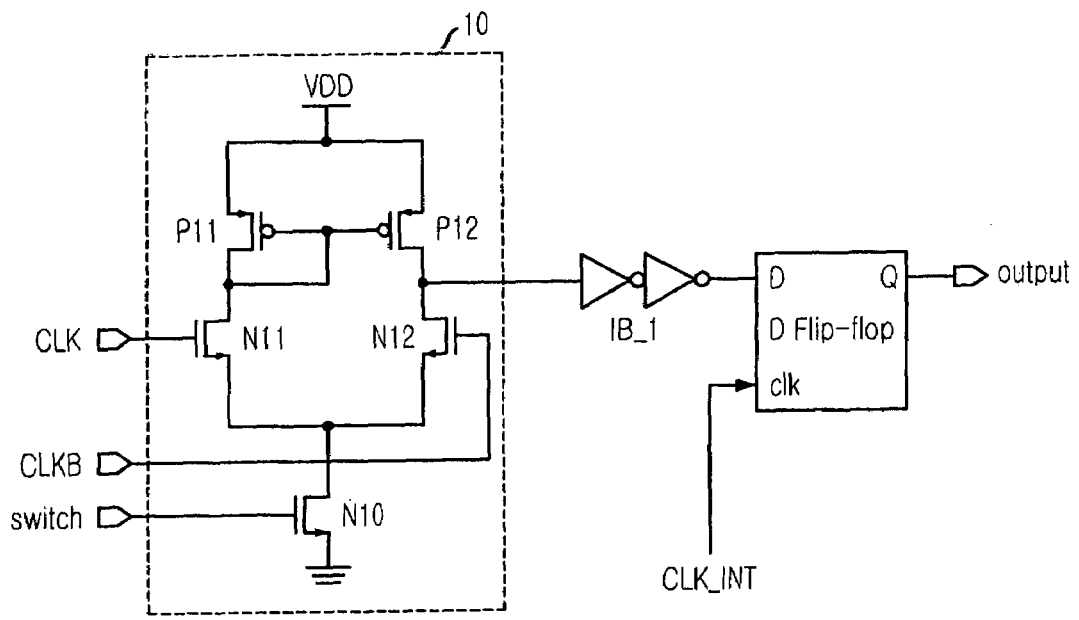
FIG. 1 is a block diagram showing a conventional input signal receiver.
Figure 2:
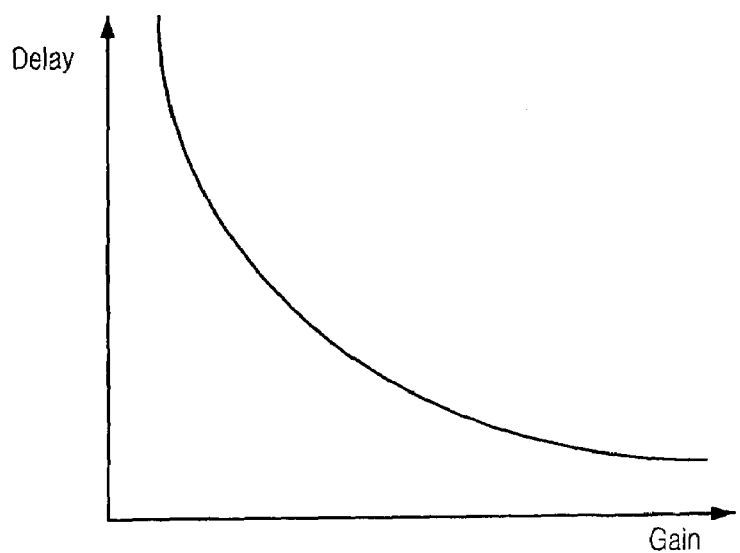
FIG. 2 is a graph showing a relationship between a gain of an amplifier and a delay time of the input signal receiver.
Figure 3:
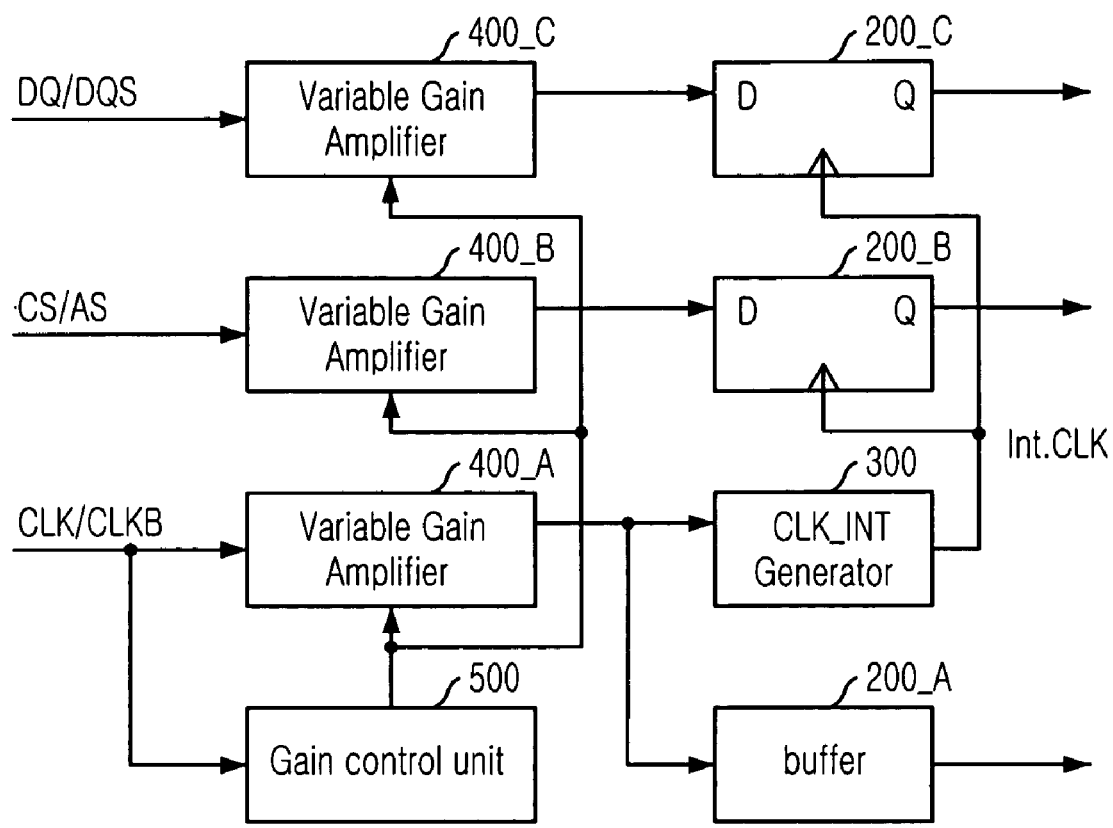
FIG. 3 is a block diagram describing a semiconductor device using an input signal receiver in accordance with a preferred embodiment of the present invention.

FIG. 3 is a block diagram describing a semiconductor device using an input signal receiver in accordance with a preferred embodiment of the present invention.

As shown, the semiconductor device is provided with a first variable gain amplifier 400_A, a clock buffer 200_A, an internal clock generator 300, second and third variable gain amplifiers 400_B and 400_C, buffers 200_B and 200_C and a gain control unit 500.

First variable gain amplifier 400_A is for sensing and amplifying an external clock CLK and an external reverse clock CLKB. The clock buffer 200_A buffers an output signal from the variable gain amplifier 400_A. The internal clock generator 300, to which an output signal from the first variable gain amplifier 400_A is inputted, outputs an internal clock CLK_INT to the buffers 200_B and 200_C. The variable gain amplifier 400_B and 400_C receive input signals from an input terminal including a semiconductor device, respectively. The buffers 200_B and 200_C are for buffering output signals from the variable gain amplifiers 400_B and 400 C in response to the internal clock CLK_INT. The gain control unit 500 outputs a gain control signal to the variable gain amplifiers 400_A, 400_B, and 400_C for determining a gain of the first variable gain amplifier 400_A and the second and third variable gain amplifiers 400_B and 400_C.

Further, the gain control unit 500 and one of the variable gain amplifiers 400_A, 400_B, and 400_C are served as an input signal receiver of the semiconductor device. The gain control unit 500 is able to be shared by the several input signal receivers. Herein, the gains of the variable gain amplifiers 400_A, 400_B, and 400_C are adjustable.

The input signal receiver receives various external signals such as a pair of a data signal DQ and a data strobe signal DQS, one of a command signal CS and an address signal AS, and a pair of the external clock CLK and the external reverse clock CLKB.

The first to third buffers 200_A, 200_B, and 200_C, to which an output from first to third the variable gain 1, amplifiers 400_A, 400_B, and 400_C are inputted, are for outputting a data sensed by the variable gain amplifiers 400_A, 400_B, and 400_C. to an another element of the semiconductor device. As shown in FIG. 3, the buffers 200_B and 200_C perform a buffering operation in response to the internal clock CLK_INT for the variable gain amplifiers 400_B and 400_C.

Figure 4:
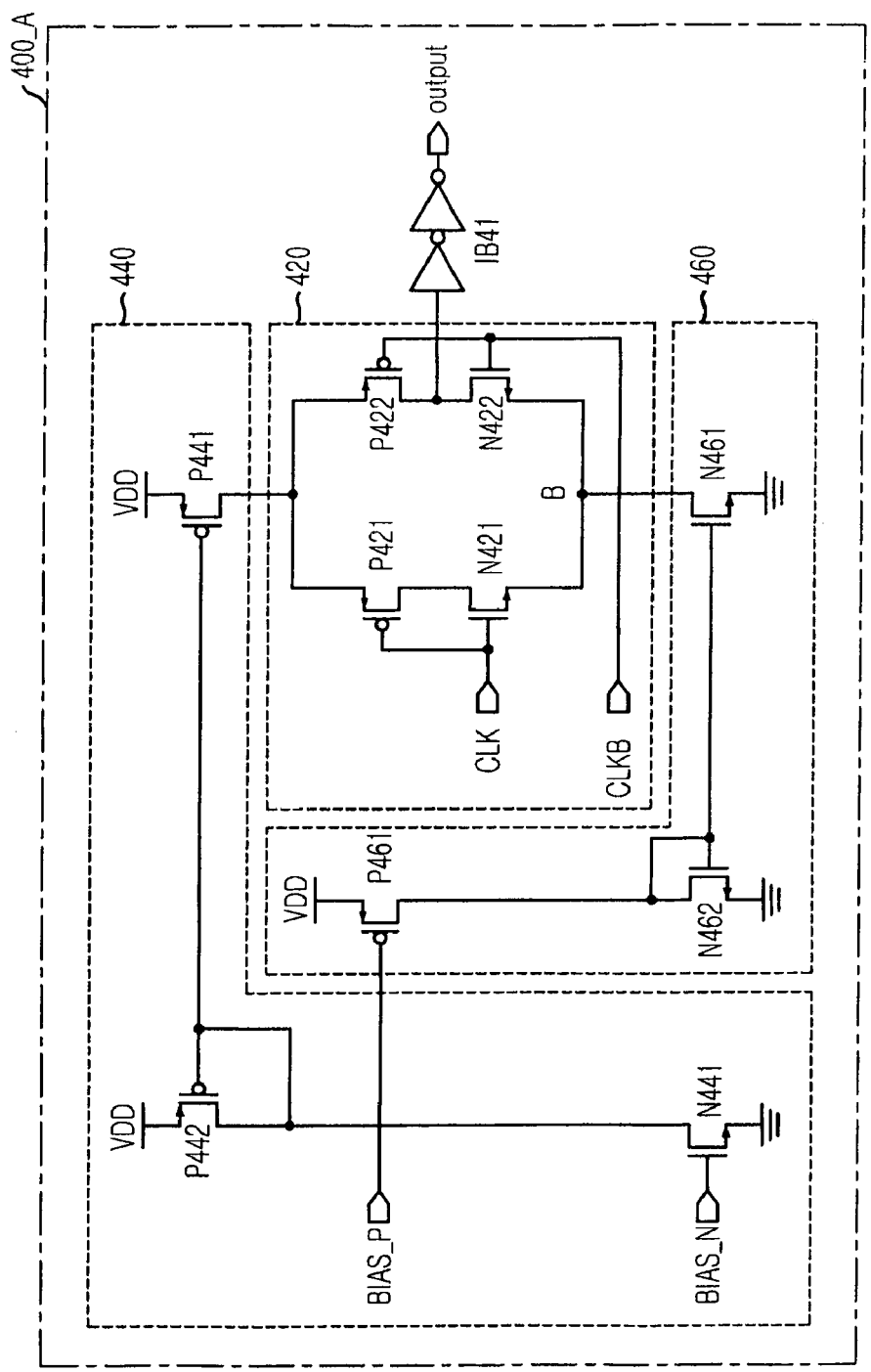
FIG. 4 is a schematic circuit diagram depicting a clock variable gain amplifier in accordance with a preferred embodiment of the present invention.

FIG. 4 is a schematic circuit diagram depicting the variable gain amplifier 400_A in accordance with a preferred embodiment of the present invention.

As shown, the variable gain amplifier 400_A for receiving a pair of the external clock CLK and the external reverse clock CLKB includes a kind of current mirror. Therefore, the variable gain amplifier 400_A increases or decreases its gain by adjusting an amount of current through using the current mirror.

Referring to FIG. 4, the variable gain amplifier 400_A is constituted with a differential amplifying block 420, an input current regulator 440, and an output current regulator 460. The differential amplifying block 420 is for receiving the external clock CLK and the external reverse clock CLKB. The input current regulator 440 controls an amount of a current supplied to the differential amplifying block 420 from a power supply voltage VDD. The output current regulator 460 controls an amount of a current flown from the differential amplifying block 420 to a ground voltage VSS.

The differential amplifying block 420 is provided with two PMOS transistors P421 and P422 and two NMOS transistors N421 and N422. The PMOS transistor P421 and the NMOS transistor N421 receive the external clock CLK through their gates, respectively. Also, the reverse external clock CLKB is inputted to the gates of the PMOS transistor P422 and the NMOS transistor N422.

Meanwhile, the input signals inputted to the differential amplifying block 420 such as the data signal DQ and the data strobe signal DQS are able to be applied to the variable gain amplifier 400_A as shown in FIG. 4. If one of the command signal CS and the address signal AS is inputted to the variable gain amplifier 400_A, a reference voltage for discriminating a logic level of the inputted signal such as CS or AS is inputted to the other input terminal of the differential amplifying block 420.

The input current regulator 440 includes two PMOS transistors P441 and P442 and a NMOS transistor N441. The PMOS transistor P441 determines the amount of current supplied to the differential amplifying block 420. The PMOS transistor P442 forms a current mirror. The NMOS transistor N441 is for receiving a gain control signal BIAS_N and controlling an amount of a mirroring current in PMOS transistor P442 with the PMOS transistor P441.

The output current regulator 460 is provided with a PMOS transistor P461 and two NMOS transistors N461 and N462. The first NMOS transistor N461 determines the amount of the current flown from the differential amplifying block 420 to a ground voltage. The second NMOS transistor N462 forms a current mirror with the first NMOS transistor N461. The PMOS transistor P461 receives a gain control signal BIAS_P for controlling an amount of a mirroring current in the second NMOS transistor N462.

As above mentioned, the PMOS transistor P441 and the NMOS transistor N461 control an amount of an operation current of the differential amplifying block 420 in response to the gain control signals BIAS_P and BIAS_N, respectively.

Figure 5:
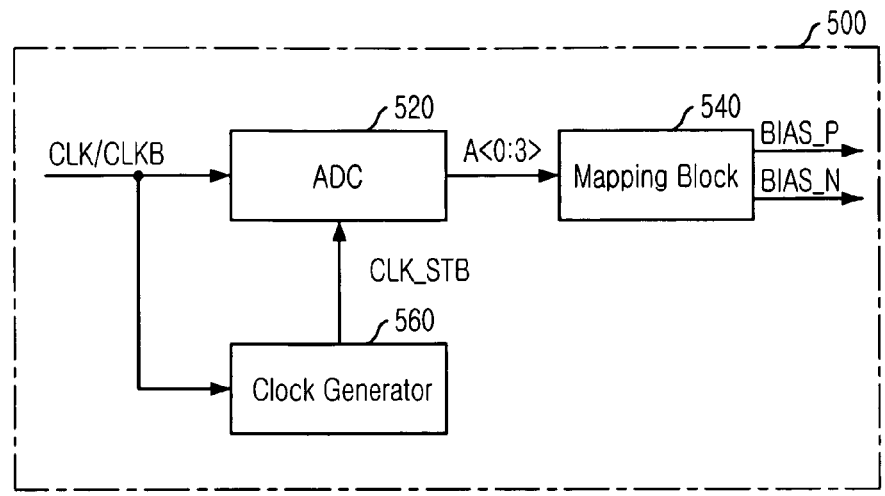
FIG. 5 is a block diagram showing a gain control unit for controlling gain applied to the variable gain amplifier shown in FIG. 4.

FIG. 5 is a block diagram showing a gain control unit 500 for controlling a gain of the variable gain amplifier 400_A.

As shown, the gain control unit 500 is provided with an analog to digital converter 520 (hereinafter referred as ADC), a mapping block 540 and a clock generator 560. The ADC 520 converts the external clock CLK and the external reverse clock CLKB into digital signals A<0:3>. The mapping block 540 converts the digital signals A<0:3> from the ADC 520 into the analog gain control signals BIAS_P and BIAS_N for controlling the gain of the variable gain amplifier 400_A. The clock generator 560 generates a strobe clock for determining a sampling point of the ADC 520. Herein, the sampling point of the ADC 520 is a peak time of the external clock CLK and the external reverse clock CLKB.

Meanwhile, the gain control unit 500 is implemented in various ways. For example, the gain control signals BIAS_P and BIAS_N are generated by level shifting levels of the external clock CLK and the external reverse clock CLKB in the peak time of the external clock CLK and the external reverse clock CLKB instead of using the ADC 520 and the mapping block 540 in FIG. 5. In other example, a sampling of the ADC 520 is performed very frequently, and therefore, a maximum sampling value is considered as the sampling value in the peak time. Herein, the clock generator 560 is not required. Further, in other example, the gain control signals BIAS_P and BIAS_N are generated by adding the sampling values sampled in the ADC 520 very frequently and generating an amplitude of the external clock CLK and the external reverse clock CLKB.

Figure 6:
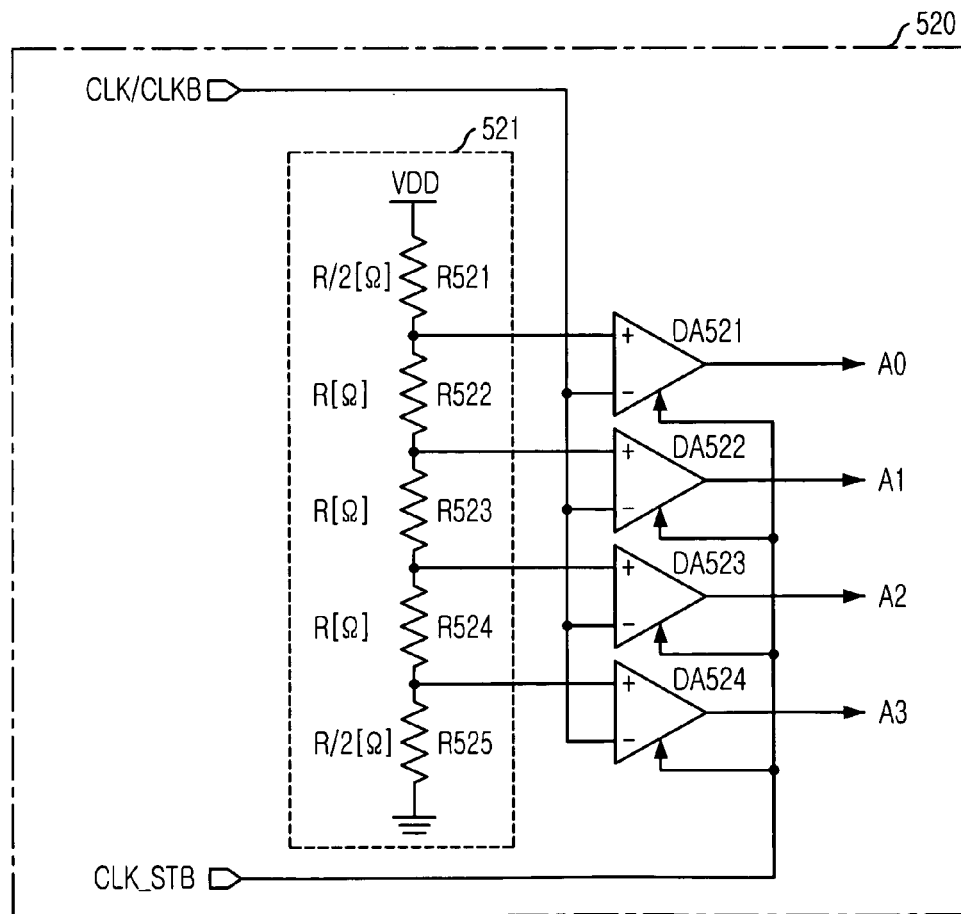
FIG. 6 is a schematic diagram describing an analog to digital converter shown in FIG. 5.

FIG. 6 is a schematic diagram of the ADC 520 shown in FIG. 5.

Referring to FIG. 6, the ADC 520 is provided with four comparators DA521 to DA524 and a sampling voltage generator 521 connected between the power supply voltage VDD and the ground voltage VSS.

The sampling voltage generator 521 is constituted with five resistors R521 to R525 connected between the power supply voltage VDD and the ground voltage VSS and generates four sampling reference voltages having different voltage level. For example, if the power supply voltage VDD is about 2.5V, and the ground voltage is about 0V, then the voltages of about 0.3125V, 0.9375V, 1.5625V, and 2.1875V are generated as the sampling reference voltages.

The sampling reference voltages are inputted to the four comparators DA521 to DA525, respectively. Each of the four comparators DA521 to DA524 compares each of the sampling reference voltages and the external clock CLK, respectively, at a rising edge of the strobe clock CLK_STB. If the external clock CLK is higher than the sampling reference voltage, each of the four comparators DA521 to DA524 outputs logic level 'LOW'. And if the external clock CLK is lower than the sampling reference voltage, each of the four comparators DA521 to DA524 outputs logic level 'HIGH'.

Herein, the strobe clock CLK_STB determining the sampling point of the ADC 520 has an equal frequency with the external clock CLK. A phase of the strobe clock CLK_STB is shifted as much as about 90° compared to the external clock CLK. The reason of shifting the phase of the strobe clock CLK_STB as much as about 90° is for controlling the ADC 520 to sample the external clock CLK at the peak point of the external clock CLK.

As above mentioned, a peak level of the external clock CLK is sensed by the four comparators DA521 to DA524 and converted into the digital signals A<0:3>, respectively. Then, the digital signals A<0:3> are inputted to the mapping block 540.

In FIG. 6, the sampling reference voltages are obtained by dividing a voltage gap between the power supply voltage VDD and the ground voltage VSS into four sampling reference voltage levels. However, if the voltage gap between the power supply voltage VDD and the ground voltage VSS is divided into more than four levels, an gain controlling ability of the gain control unit 500 is improved.

Further, when it is guaranteed that a high level of the external clock CLK is higher than the VDD/2, the power supply voltage VDD and VDD/2 is able to be applied to the ADC 520 instead of the power supply voltage VDD and the ground voltage VSS.

Figure 7:
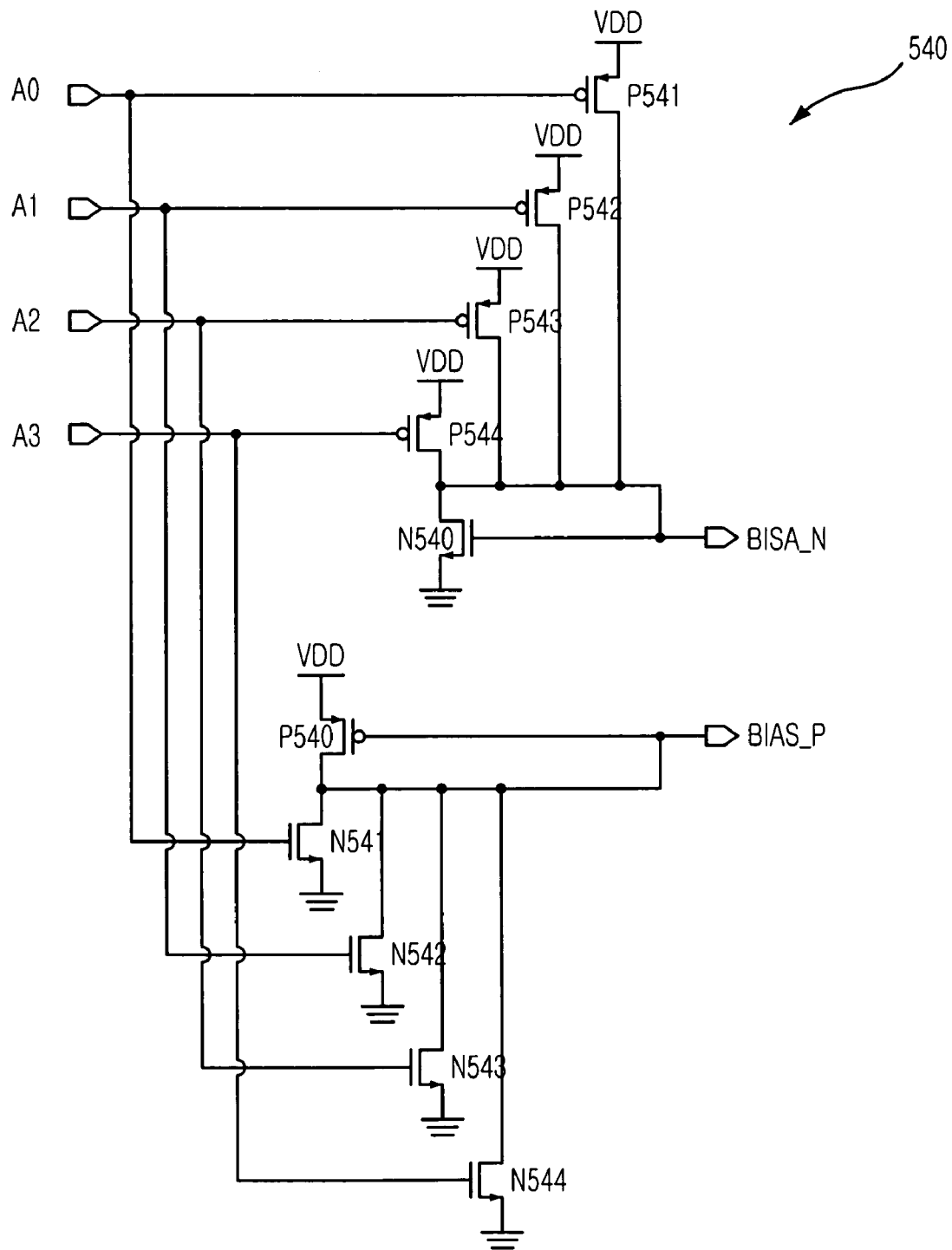
FIG. 7 is a schematic circuit diagram showing a mapping block shown in FIG. 5.

FIG. 7 is a schematic circuit diagram showing the mapping block 540 shown in FIG. 5.

Referring to FIG. 7, the mapping block 540 is provided with five PMOS transistors P540 to P544 and five NMOS transistors N540 to N544. The PMOS transistor P540 and the NMOS transistors N541 to N544 participate in generating the gain control signal BIAS_P, and the NMOS transistor N540 and the PMOS transistors P541 to P544 participates in generating the gain control signal BIAS_N.

A combination of the digital signals A<0:3> determines amount of current flowing through the PMOS transistor P540 and the NMOS transistor N540. In accordance with the amount of current flowing through the PMOS transistor P540 and the NMOS transistor N540, the level of the gate voltage of the PMOS transistor P540 and the NMOS transistor N540 is determined, respectively. Herein, the gate voltage of the PMOS transistor P540 and the NMOS transistor N540 are the gain control signal BIAS_P and BIAS_N, respectively.

Figure 8:
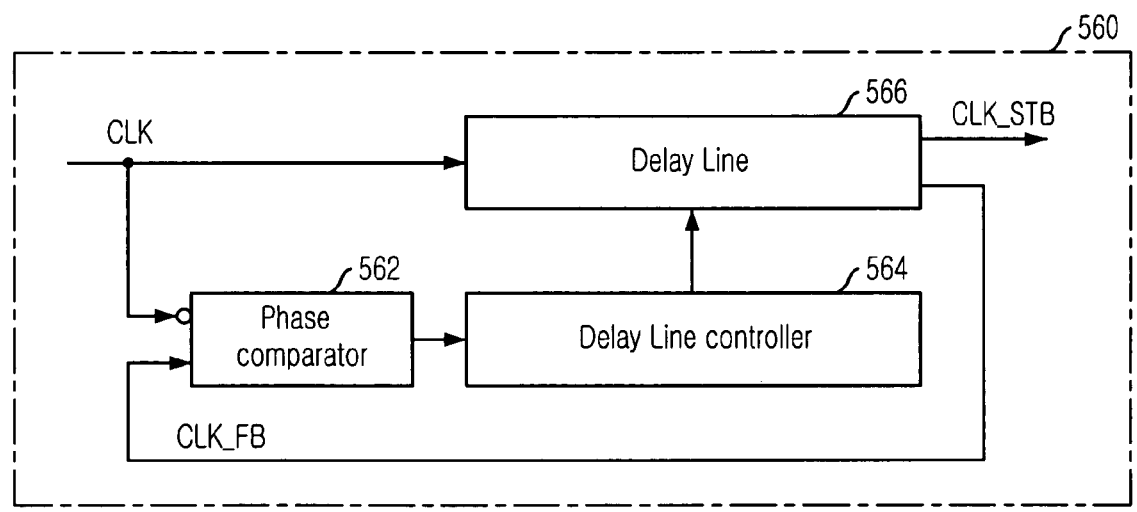
FIG. 8 is a block diagram depicting a clock generator shown in FIG. 5.

FIG. 8 is a block diagram of the clock generator 560 shown in FIG. 5.

Referring to FIG. 8, the clock generator 560 is provided with a phase comparator 562, a delay line controller 564, and a delay line 566. The delay line 566 receives the external clock CLK and delays it for a predetermined period; and, then, outputs a delayed signal as a feedback clock CLK_FB. The feedback clock CLK_FB outputted from the delay line 566. The external clock CLK is reversed and inputted to the phase comparator 562. Therefore, the phase comparator 562 receives the feedback clock CLK_FB and the reversed external clock CLK.

Figure 9:
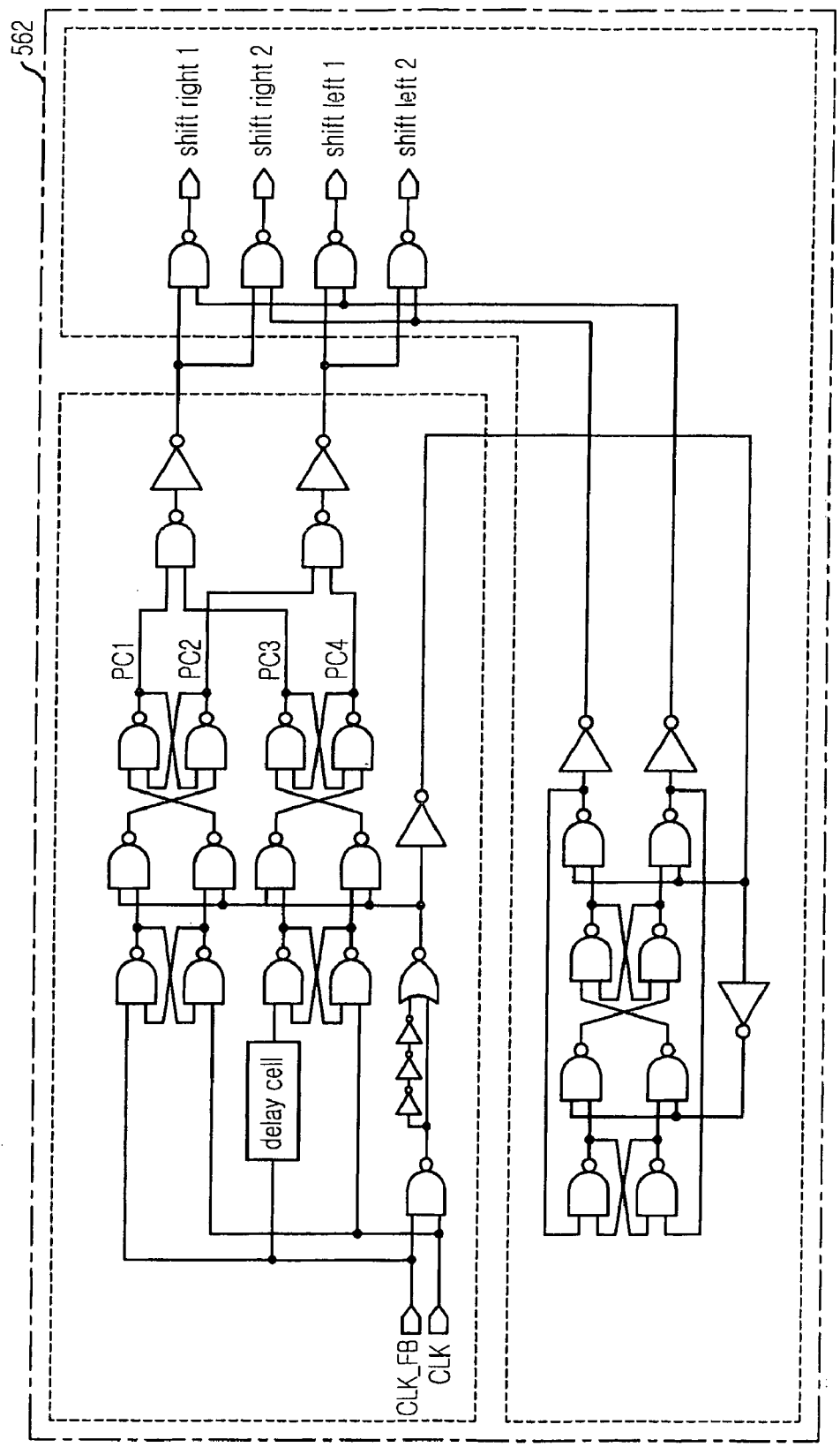
FIG. 9 is a schematic circuit diagram showing a phase comparator shown in FIG. 8.

FIG. 9 is a schematic circuit diagram showing the phase comparator 562 shown in FIG. 8.

Figure 10:
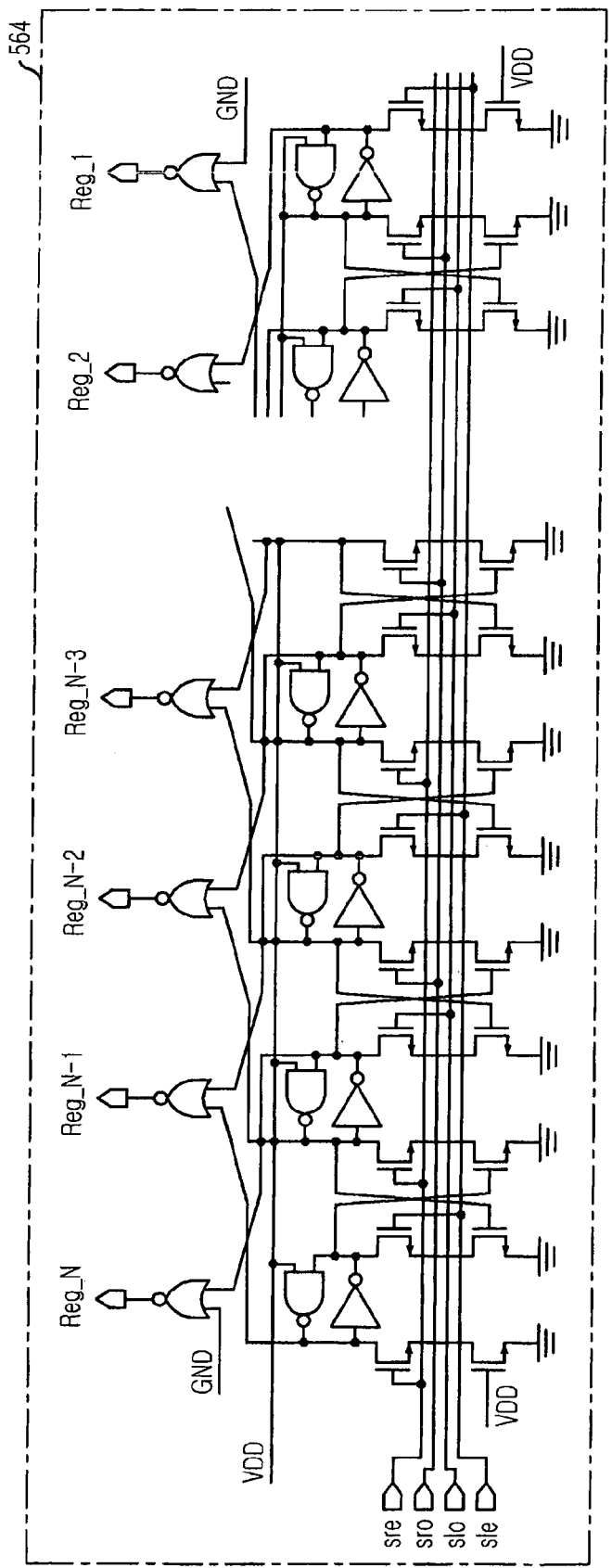
FIG. 10 is a schematic circuit diagram showing a delay line controller shown in FIG. 8.

FIG. 10 is a schematic circuit diagram showing the delay line controller 564 shown in FIG. 8.

The delay line controller 564 in FIG. 10 has the same structure with a conventional DLL circuit and performs the same operation.

Figure 11:
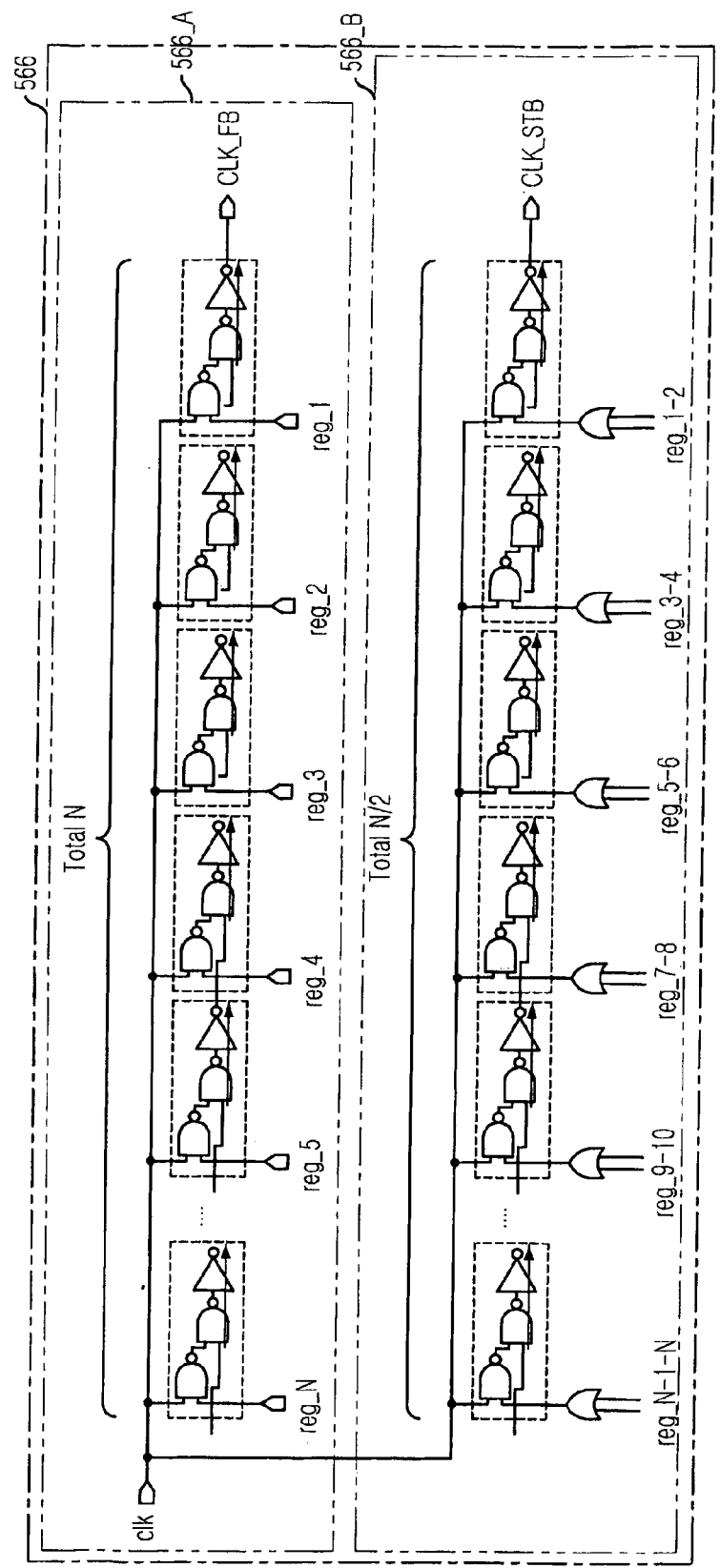
FIG. 11 is a schematic circuit diagram showing a delay line shown in FIG. 8.

FIG. 11 is a schematic circuit diagram showing the delay line 566 shown in FIG. 8.

Referring to FIG. 11, the delay line 566 is provided with two delay lines 566_A and 566_B. The delay line 566_A is for the feedback clock CLK_FB, and the delay line 566_B is for the strobe clock CLK_STB. The length of the delay line 566_A is twice as long as the length of the delay line 566_B. In other words, the delay line 566_A is provided with N numbers of registers, the delay line 566_B is provided with N/2 numbers of registers. The strobe clock CLK_STB is delayed as much as 90° in response to an output signal from the delay line controller 564.

Figure 12:
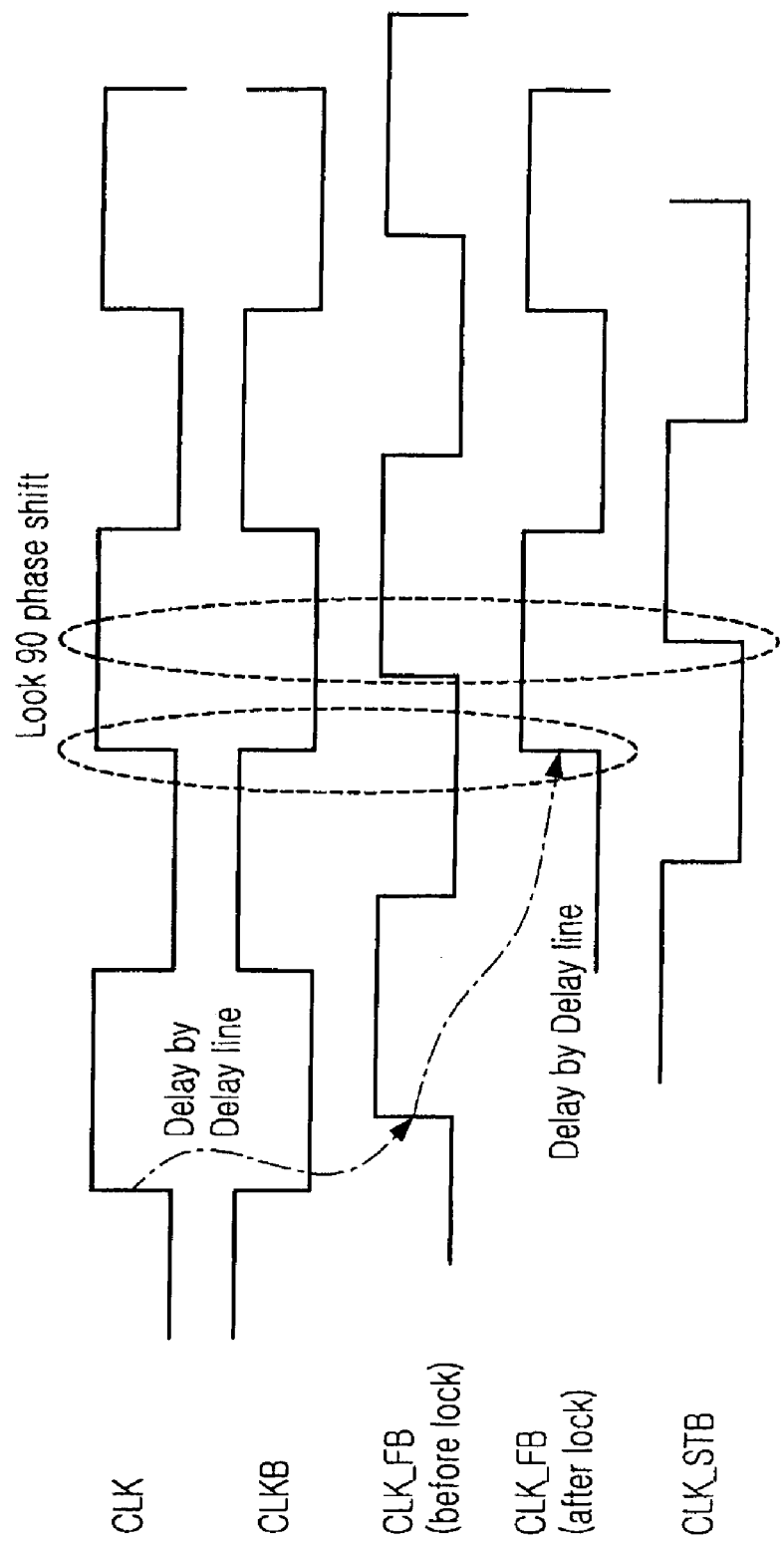
FIG. 12 is a timing diagram illustrating overall operation of a clock generator in accordance with a preferred embodiment of the present invention.

FIG. 12 is a timing diagram showing overall operation of the clock generator 560 in accordance with the preferred embodiment.

Looking at the FIG. 12, at first the external clock CLK is inputted. Then, the feedback clock CLK_FB shifted as much as 90° is generated in the delay line 566. The feedback clock CLK_FB is feedbacked to the phase comparator 562, and the external clock CLK is inverted and inputted to the phase comparator 562. An output signal outputted from the phase comparator 562 in response to the inversed external clock CLK and feedback clock CLK_FB is inputted to the delay line controller 564. Then, the delay line generates the strobe signal CLK_STB determining the sampling point of the ADC 520. Herein, the phase of the strobe clock CLK_STB is shifted as much as 90° from the external clock CLK.

In the above preferred embodiment of the present invention, in order to determined the gain of the variable gain amplifier 400_A, the gain control unit 500 uses the external clock CLK and the external reverse clock CLKB. However, in another embodiment, one of the data signal DQ, the data strobe signal DQS, the command signal CS, and the address signals AS is able to used to determine the gain of the variable gain amplifier 400_A.

Further, in the above preferred embodiment, the ADC 520 is implemented to extract the level of the input signal, i.e., the external clock CLK at the high peak point; however, in still another embodiment the ADC is able to be implemented to extract the level of the input signal at the low peak point.

The present application contains subject matter related to Korean patent application No. 2004-108543, filed in the Korean Patent Office on Dec. 20, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An input signal receiver for use in a semiconductor device, comprising:
   a gain controlling means for outputting a gain control signal;
   a variable gain amplifying means for amplifying external input signals in response to the gain control signal; and
   a buffering means whose input terminal is connected to an output terminal of the variable gain amplifying means,
   wherein the gain control signal determines a gain of the variable gain amplifying means.

2. The input signal receiver as recited in claim 1, wherein the variable gain amplifying means includes:
   a differential amplifying means for amplifying a difference between an input signal and a reversed input signal and outputting a logic value corresponding to the difference; and
   a current regulator for controlling an operation current of the differential amplifying means according to the gain control signal.

3. The input signal receiver as recited in claim 2, wherein the differential amplifying means is provided with a first and a second MOS transistor pairs for receiving the input signal and the reversed input signal, respectively, wherein each of the first and the second MOS transistor pairs includes a PMOS transistor and an NMOS transistor.

4. The input signal receiver as recited in claim 2, wherein the current regulator includes:
   a pass MOS transistor for controlling the amount of the operation current;
   a mirror MOS transistor for forming a current mirror with the pass MOS transistor; and
   an input MOS transistor for receiving the gain control signal through a gate to thereby control an amount of a mirroring current from the mirror MOS transistor.

5. The input signal receiver as recited in claim 2, wherein the current regulator includes:
   an input current regulator for controlling an amount of a current being inputted from a power supply voltage to the differential amplifying means; and
   an output current regulator for controlling an amount of a current being outputted from the differential amplifying means to a ground voltage.

6. The input signal receiver as recited in claim 1, wherein the variable gain amplifying means further includes:
   a differential amplifying means for amplifying a difference between an input signal and a reference voltage and outputting the difference as a logic value; and
   a current regulator for providing a path for an operation current of the differential amplifying means and controlling an amount of the operation current in accordance with the gain control signal.

7. The input signal receiver as recited in claim 6, wherein the differential amplifying means is provided with a first and a second MOS transistor pairs for receiving the input signal and the reference voltage, respectively, wherein each of the first and the second MOS transistor pairs includes a PMOS transistor and an NMOS transistor.

8. The input signal receiver as recited in claim 6, wherein the current regulator includes:
   a pass MOS transistor for controlling the amount of the operation current;
   a mirror MOS transistor for forming a current mirror with the pass MOS transistor; and
   an input MOS transistor for receiving the gain control signal through a gate and controlling an amount of a mirroring current from the mirror MOS transistor.

9. The input signal receiver as recited in claim 6, wherein the current regulator includes:
   an input current regulator for controlling an amount of a current being inputted from a power supply voltage to the differential amplifying means; and
   an output current regulator for controlling an amount of a current being outputted from the differential amplifying means to a ground voltage.

10. The input signal receiver as recited in claim 1, wherein the gain controlling means includes:
    an analog to digital converter (ADC) for converting an external clock into a digital signal;
    a strobe clock generator for generating a strobe clock transmitted to the ADC at a peak point of the external clock; and
    a mapping block for generating the gain control signal corresponding to the digital signal outputted from the ADC.

11. The input signal receiver as recited in claim 10, wherein the strobe clock generator includes:
    a delay line block for generating the strobe clock by delaying the external clock for a predetermined period;
    a phase comparator for generating a phase signal by comparing the external clock with the strobe clock; and
    a delay line controller for controlling the predetermined period.

12. The input signal receiver as recited in claim 11, wherein the ADC includes:
    a reference voltage generator for generating N numbers of reference voltages; and
    a N numbers of comparators each of which compares the external clock with a corresponding one of the reference voltages and outputs a corresponding logic signal.

13. The input signal receiver as recited in claim 12, wherein the mapping block includes:
    N number of MOS transistors, each for being switched in accordance with the corresponding logic signal; and
    a control MOS transistor for providing a path for a current of the N numbers of MOS transistors and outputting an gate voltage as the gain control signal.

14. A semiconductor device for compensating an input signal, comprising:
    a clock variable gain amplifying means for amplifying an external clock and an external reverse clock based on a gain control signal;
    an internal clock generator for generating an internal clock by using an output signal from the clock variable gain amplifying means;
    an input variable gain amplifying means for receiving the input signal through an input terminal of the semiconductor device and amplifying the input signal based on the gain control signal;
    a buffering means for buffering an output signal from the input variable gain amplifying means in response to the internal clock; and a gain control unit for outputting the gain control signal for determining a gain of the clock variable gain amplifying means and the input variable gain amplifying means.

15. The semiconductor device as recited in claim 14, wherein the clock variable gain amplifying means includes:
a differential amplifying means for amplifying a difference between the external clock and the external reverse clock and outputting a logic value corresponding to the difference; and
a current regulator for providing a path for an operation current of the differential amplifying means and controlling an amount of the operation current in response to the gain control signal.

16. The semiconductor device as recited in claim 14, wherein the input variable gain amplifying means includes:
a differential amplifying means for amplifying a difference between an input signal and an input reverse signal and outputting a logic signal; and
a current regulator for providing a path for an operation current of the differential amplifying means and controlling an amount of the operation current in response to the gain control signal.

17. The semiconductor device as recited in claim 14, wherein the input variable gain amplifying means includes:
a differential amplifying means for amplifying a difference between an input signal and a reference voltage and outputting a logic signal; and
a current regulator for providing a path for an operation current of the differential amplifying means and controlling an amount of the operation current in response to the gain control signal.

18. The semiconductor device as recited in claim 14, wherein the gain control unit includes:
an analog to digital converter (ADC) for converting the external clock into a digital signal;
a strobe clock generator for generating a strobe clock being transmitted at a peak point of the external clock; and
a mapping block for generating the gain control signal corresponding to the digital signal of the ADC.

19. A method for sensing and compensating an input signal comprising steps of:
(a) receiving the input signal and an external clock;
(b) generating a gain control signal based on a level of the external clock;
(c) amplifying the input signal as much as a gain based on the gain control signal; and
(d) buffering and outputting the amplified input signal.

20. The method as recited in claim 19, wherein step (b) includes steps of:
(b1) extracting a peak point level of the external clock;
(b2) generating a digital signal by comparing the peak point level of the external clock and the level of the external clock; and
(b3) generating the gain control signal with a level corresponding to the digital signal.

21. The input signal receiver as recited in claim 12, wherein the reference voltage generator generates the N numbers of reference voltages by dividing a difference between a power supply voltage and a ground voltage.

22. The semiconductor device as recited in claim 18, wherein the strobe clock generator includes:
a delay line block for generating the strobe clock by delaying the external clock for a predetermined period;
a phase comparator for generating a phase signal by comparing the external clock with the strobe clock; and
a delay line controller for controlling the predetermined period.

23. The semiconductor device as recited in claim 22, wherein the ADC includes:
a reference voltage generator for generating N numbers of reference voltages; and
N numbers of comparators each of which compares the external clock with a corresponding one of the reference voltages and outputting a corresponding logic signal.

24. The semiconductor device as recited in claim 23, wherein the mapping block includes:
N number of MOS transistors, each for being switched in accordance with the corresponding logic signal; and
a control MOS transistor for providing a path for a current of the N numbers of MOS transistors and outputting an gate voltage as the gain control signal.

25. The semiconductor device as recited in claim 23, wherein the reference voltage generator generates the N numbers of reference voltages by dividing a difference between a power supply voltage and a ground voltage.

* * * * *